(12) United States Patent
Okada et al.

(10) Patent No.: US 7,445,731 B2
(45) Date of Patent: Nov. 4, 2008

(54) METALLIC COLLOIDAL SOLUTION AND INKJET-USE METALLIC INK

(75) Inventors: Issei Okada, Osaka (JP); Kohei Shimoda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 40 days.

(21) Appl. No.: 11/067,939

(22) Filed: Mar. 1, 2005

(65) Prior Publication Data

US 2005/0189520 A1 Sep. 1, 2005

(30) Foreign Application Priority Data

Mar. 1, 2004 (JP) .............................. 2004-056571
Mar. 1, 2004 (JP) .............................. 2004-056572

(51) Int. Cl.
*H01B 1/02* (2006.01)
*H01B 1/08* (2006.01)
*H01B 1/12* (2006.01)

(52) U.S. Cl. .................. 252/512; 252/518.1; 252/519.3; 252/500

(58) Field of Classification Search ................. 252/512, 252/518.1, 519.3, 500
See application file for complete search history.

(56) References Cited

U.S. PATENT DOCUMENTS

| | | | | |
|---|---|---|---|---|
| 6,951,666 B2* | 10/2005 | Kodas et al. | ............. | 427/376.6 |
| 2003/0110978 A1* | 6/2003 | Abe et al. | ................. | 106/31.13 |
| 2003/0124259 A1 | 7/2003 | Kodas et al. | | |

FOREIGN PATENT DOCUMENTS

| | | |
|---|---|---|
| EP | 1323793 | 7/2003 |
| JP | 11-080647 | 3/1999 |
| JP | 11-80647 | 3/1999 |
| JP | 2001-035255 A | 2/2001 |
| JP | 2002-121437 | 4/2002 |
| JP | 2003-193119 A | 7/2003 |
| JP | 2003-193119 * | 9/2003 |
| JP | 2004-175832 | 6/2004 |
| WO | WO 02/18080 A1 | 3/2002 |
| WO | WO 03/038002 A1 | 5/2003 |

OTHER PUBLICATIONS

Japanese Office Action in corresponding Japanese Patent Application No. 056572/2004, dated Jul. 4, 2006.
Japanese Office Action corresponding to Patent Application No. 2004-05671, filed on Aug. 8, 2006.

* cited by examiner

*Primary Examiner*—Douglas McGinty
*Assistant Examiner*—Jaison P Thomas
(74) *Attorney, Agent, or Firm*—McDermott Will & Emery LLP

(57) ABSTRACT

A metallic colloidal solution (a) includes a water-based dispersion medium that is easy in handling with regard to safety and environment and metallic particles having a uniform particle diameter and being excellent in properties such as conductivity and (b) has properties suitable for various printing methods and ink-applying methods. In addition, an inkjet-use metallic ink incorporating the metallic colloidal solution has properties suitable for the inkjet printing method. The metallic particles are deposited by reducing metallic ions in water and have a primary-particle diameter of at most 200 nm. The dispersion medium is made of a mixed solvent of water and a water-soluble organic solvent. The metallic particles are dispersed in the dispersion medium under the presence of a dispersant having a molecular weight of 200 to 30,000.

8 Claims, 3 Drawing Sheets

METALLIC COLLOIDAL SOLUTION AND INKJET-USE METALLIC INK

BACKGROUND OF THE INVENTION

1. Field of the Invention

The present invention relates to a metallic colloidal solution and an inkjet-use metallic ink both suitable for forming a fine wiring circuit, a thin conductive film with a uniform thickness, and the like.

2. Description of the Background Art

Wiring circuits, conductive films, and the like are formed by using extremely minute metallic particles having a diameter of several nanometers to tens of nanometers or so. More specifically, such metallic particles are dispersed in a dispersion medium under the presence of a dispersant for preventing aggregation and increasing the dispersibility to obtain a metallic colloidal solution. The metallic colloidal solution is used as an ink for various printing methods and ink-applying methods. The ink is printed or applied on a substrate and, as required, is baked to form a wiring circuit or a conductive film.

As the metallic colloidal solution, a water-based solution using water as the dispersion medium has been widely used. In addition, the solution's properties such as viscosity, surface tension, and vapor pressure (a boiling point) are limited within a narrow range. However, wiring circuits and conductive films have been formed in recent years through various printing methods and ink-applying methods, such as the spin coating method, the screen printing method, and the dispenser application method. Consequently, the metallic colloidal solution is required to have properties suitable for individual printing methods and ink-applying methods.

Furthermore, as the forming method of a wiring circuit and a conductive film, the inkjet printing method, which uses an inkjet printer, has been attracting attention in recent years. Studies are being made to use the metallic colloidal solution as the metallic ink for the inkjet printing method. However, the conventional metallic colloidal solution is usually produced as a water-based solution using water as the dispersion medium. In addition, the solution's properties such as viscosity, surface tension, and vapor pressure (a boiling point) are limited within a narrow range.

In view of the above-described circumstances, studies are being conducted to use not only water but also various organic solvents as the dispersion medium, which directly affects the properties of the metallic colloidal solution. For example, the published Japanese patent application Tokukaihei 11-80647 has disclosed the below described methods of producing a metallic colloidal solution (see claims 11 and 12 and sections 0042, 0045, and 0046 of this application). This application utilizes the liquid-phase reduction method, which is known as a method capable of producing metallic particles with a uniform particle diameter. More specifically, Tokukaihei 11-80647 applies a method of producing a water-based metallic colloidal solution by depositing metallic particles through the reduction of metallic ions in water under the presence of a dispersant. Tokukaihei 11-80647 has disclosed the following methods:

(a) a method of producing a metallic colloidal solution whose dispersion medium is an organic solvent. In this method, first, a metallic compound, which is the source of metallic ions, is solved in an organic solvent. After the addition of a dispersant, the metallic ions are reduced to deposit metallic particles.

(b) a method of producing a metallic colloidal solution whose dispersion medium is a mixed solvent of water and a water-soluble organic solvent. In this method, first, a metallic compound, which is the source of metallic ions, is solved in water. After the addition of a water-soluble organic solvent and a dispersant, the metallic ions are reduced to deposit metallic particles.

Another published Japanese patent application, Tokukai 2001-35255, has disclosed a method of producing a metallic colloidal solution in which metallic particles are dispersed in an organic solvent (in Tokukai 2001-35255, the solution is called a liquid in which extremely fine silver particles are dispersed independently) (see section 0006 of Tokukai 2001-35255). This application utilizes a method of producing metallic particles through the vapor-phase growth method. First, metallic particles growing in a vapor phase are made contact with a vapor of a high-boiling-point organic solvent such as mineral spirits. Then, the metallic particles are cooled and recovered to produce the solution.

However, in one of the methods disclosed in Tokukaihei 11-80647, which one uses an organic solvent as the dispersion medium, the types of metallic compound and reducing agent both having good solubility in a specific organic solvent are limited. This limitation poses a problem of limiting the type of metallic particles to be formed.

On the other hand, in the other method, which uses a mixed solvent of water and a water-soluble organic solvent, although commonly used water-soluble metallic compounds and water-soluble reducing agents can be used, many of them have low solubility in a water-soluble organic solvent. As a result, at the time the water-soluble organic solvent is added, some of them are deposited or forced to behave adversely to cause the reaction system to become prone to produce nonuniformity in concentration.

This nonuniformity in concentration causes the formed metallic particles to have variations in particle diameter. Consequently, the produced wiring circuit and conductive film may become nonuniform in properties such as structure and conductivity.

When this metallic colloidal solution is used as an inkjet-use metallic ink, the nozzle and another small opening of an inkjet printer tend to be clogged. Furthermore, the formed wiring circuit and conductive film may become non-uniform in properties such as structure and conductivity. In addition, unreacted metallic compounds may enter the metallic particles as an impurity. When this occurs, the metallic particles and, consequently, the wiring circuit and conductive film may be impaired in properties such as conductivity.

On the other hand, the method disclosed in Tokukai 2001-35255 is limited to the application that uses a high-boiling-point organic solvent, which requires careful handling with regard to safety and environment. In other words, this method has a drawback of a narrow range of application. Furthermore, when this metallic colloidal solution is used as an inkjet-use metallic ink, the organic solvent such as mineral spirits may dissolve the adhesive used in the head and other components of the inkjet printer.

SUMMARY OF THE INVENTION

The present invention offers a metallic colloidal solution (a) that includes a water-based dispersion medium that is easy in handling with regard to safety and environment and metallic particles having a uniform particle diameter and being excellent in properties such as conductivity and (b) that has properties suitable for various printing methods and ink-applying methods. The present invention also offers an inkjet-use metallic ink that incorporates the above-described metallic colloidal solution and that has properties suitable for the inkjet printing method.

The present invention offers a metallic colloidal solution that includes:

(a) metallic particles that are deposited by reducing metallic ions in water and that have a primary-particle diameter of at most 200 nm;
(b) a dispersant having a molecular weight of 200 to 30,000; and
(c) a dispersion medium made of a mixed solvent of water and a water-soluble organic solvent.

A metallic colloidal solution of the present invention incorporates metallic particles that are produced by an ordinary liquid-phase reduction method using water and that have a uniform particle diameter. Therefore, the metallic colloidal solution can prevent variations in the structure, conductivity, and so on of the formed wiring circuit and conductive film. In other words, the formed wiring circuit and conductive film can have increased uniformity in those properties. In addition, the metallic particles are nearly free from impurities such as unreacted metallic compounds. Consequently, the metallic particles have notably high conductivity, so that they can improve the conductivity of the wiring circuit and conductive film.

The metallic colloidal solution incorporates a dispersion medium made of a mixed solvent of water and a water-soluble organic solvent. Therefore, it is easy to handle with regard to safety and environment. Furthermore, properties such as viscosity, surface tension, and vapor pressure of the metallic colloidal solution can be easily adjusted to fall within a range suitable for various printing methods and ink-applying methods by adjusting the composition ratio of the water and the water-soluble organic solvent in the mixed solvent and by selecting the type of the water-soluble organic solvent.

A metallic colloidal solution of the present invention may be produced:

(a) by using as a starting material a water-based metallic colloidal solution obtained by depositing metallic particles through the reduction of metallic ions in water; and
(b) without undergoing a process that completely separates the metallic particles from water.

In this case, a water-based metallic colloidal solution obtained by the reductive deposition method is used as a starting material. Then, the metallic colloidal solution is produced without undergoing a process that completely separates the metallic particles from water. Therefore, the metallic colloidal solution can be produced without the production of secondary particles due to aggregation resulting from the complete separation of the metallic particles from water. Consequently, this process can prevent drawbacks caused by the secondary particles, such as a variation in particle diameter and an increase in particle diameter as a whole. As a result, the produced metallic colloidal solution maintains a state in which the metallic particles are dispersed uniformly in the dispersion medium as nearly the primary particles, which state is created directly after the production of the metallic particles by the reductive deposition method. The use of such a metallic colloidal solution can further increase the uniformity of the structure and conductivity of the wiring circuit and conductive film.

A metallic colloidal solution of the present invention may incorporate metallic particles that are particles made of a metal selected from the group consisting of nickel, copper, silver, gold, platinum, palladium, and an alloy of these metals.

In this case, the use of highly conductive metallic particles made of nickel, copper, silver, gold, platinum, palladium, or an alloy of these metals can further increase the conductivity of the wiring circuit and conductive film.

A metallic colloidal solution of the present invention may contain metallic particles with a content of 0.1 to 90 wt. %.

In this case, the containing of the metallic particles with any content in the range of 0.1 to 90 wt. % enables easy adjustment of properties of the metallic colloidal solution so that they can fall within a range suitable for various printing methods and ink-applying methods.

A metallic colloidal solution of the present invention may incorporate a dispersant made of an organic compound that does not contain any of sulfur, phosphorus, boron, and a halogen atom.

In this case, the use of a dispersant made of an organic compound that does not contain sulfur, phosphorus, boron, or a halogen atom can prevent not only the wiring circuit and conductive film but also other members such as electronic components placed in the vicinity of them from deteriorating because of the presence of these elements.

A metallic colloidal solution of the present invention may contain a dispersant with a content of 2 to 30 weight parts per 100 weight parts of the metallic particles.

In this case, the containing of the dispersant with a content of 2 to 30 weight parts per 100 weight parts of the metallic particles can prevent the metallic particles from aggregating in the metallic colloidal solution. As a result, a highly conductive wiring circuit and conductive film can be formed.

A metallic colloidal solution of the present invention may incorporate a water-soluble organic solvent made of at least one material selected from the group consisting of alcohol, ketone, glycol ether, and a water-soluble nitrogen-containing organic compound.

In this case, the use of the water-soluble organic solvent made of at least one material selected from the group consisting of alcohol, ketone, glycol ether, and a water-soluble nitrogen-containing organic compound enables easy adjustment of properties of the metallic colloidal solution so that they can fall within a range suitable for various printing methods and ink-applying methods.

According to an aspect of the present invention, the present invention offers an inkjet-use metallic ink incorporating a metallic colloidal solution that includes:

(a) metallic particles that are deposited by reducing metallic ions in water and that have a primary-particle diameter of at most 200 nm;
(b) a dispersant having a molecular weight of 200 to 30,000; and
(c) a dispersion medium made of a mixed solvent of water and a water-soluble organic solvent.

An inkjet-use metallic ink of the present invention incorporates metallic particles that are produced by an ordinary liquid-phase reduction method using water and that have a uniform particle diameter. Therefore, the inkjet-use metallic ink can prevent the nozzle and another small opening of an inkjet printer from clogging. Furthermore, it can prevent variations in the structure, conductivity, and so on of the formed wiring circuit and conductive film. In other words, the formed wiring circuit and conductive film can have increased uniformity in those properties. In addition, the metallic particles are nearly free from impurities such as unreacted metallic compounds. Consequently, the metallic particles have notably high conductivity, so that they can improve the conductivity of the wiring circuit and conductive film.

The inkjet-use metallic ink incorporates a dispersion medium made of a mixed solvent of water and a water-soluble organic solvent. Therefore, it is easy to handle with regard to safety and environment. Furthermore, properties such as viscosity, surface tension, and vapor pressure of the inkjet-use metallic ink can be easily adjusted to fall within a range suitable for the inkjet printing method by adjusting the composition ratio of the water and the water-soluble organic solvent in the mixed solvent and by selecting the type of the water-soluble organic solvent.

An inkjet-use metallic ink of the present invention may have a surface tension of 20 to 60 mN/m at 25° C. and a viscosity of 0.5 to 40 mPa·s at 25° C.

In this case, because the surface tension is adjusted to fall within the range of 20 to 60 mN/m at 25° C. and the viscosity of 0.5 to 40 mPa·s at 25° C., the ink can be ejected satisfactorily from the nozzle by the inkjet printing method without developing any faulty ejection such as the clogging at the nozzle and another small opening. Thus, the wiring circuit and conductive film can be formed satisfactorily.

An inkjet-use metallic ink of the present invention may incorporate a metallic colloidal solution that is produced:
(a) by using as a starting material a water-based metallic colloidal solution obtained by depositing metallic particles through the reduction of metallic ions in water; and
(b) without undergoing a process that completely separates the metallic particles from water.

In this case, a water-based metallic colloidal solution obtained by the reductive deposition method is used as a starting material. Then, the inkjet-use metallic ink is produced without undergoing a process that completely separates the metallic particles from water. Therefore, the inkjet-use metallic ink can be produced without the production of secondary particles due to aggregation resulting from the complete separation of the metallic particles from water. Consequently, this process can prevent drawbacks caused by the secondary particles, such as a variation in particle diameter and an increase in particle diameter as a whole. As a result, the produced inkjet-use metallic ink maintains a state in which the metallic particles are dispersed uniformly in the dispersion medium as nearly the primary particles, which state is created directly after the production of the metallic particles by the reductive deposition method. The use of such an inkjet-use metallic ink can further reliably prevent the clogging at the nozzle and another small opening of the inkjet printer. In addition, the uniformity of the structure and conductivity of the wiring circuit and conductive film can be increased.

An inkjet-use metallic ink of the present invention may incorporate a metallic colloidal solution incorporating a water-soluble organic solvent made of at least one material selected from the group consisting of alcohol, ketone, glycol ether, and a water-soluble nitrogen-containing organic compound.

In this case, the use of the water-soluble organic solvent made of at least one material selected from the group consisting of alcohol, ketone, glycol ether, and a water-soluble nitrogen-containing organic compound enables easy adjustment of properties of the inkjet-use metallic ink so that they can fall within a range suitable for the inkjet printing method.

DETAILED DESCRIPTION OF THE INVENTION

Figure 1:
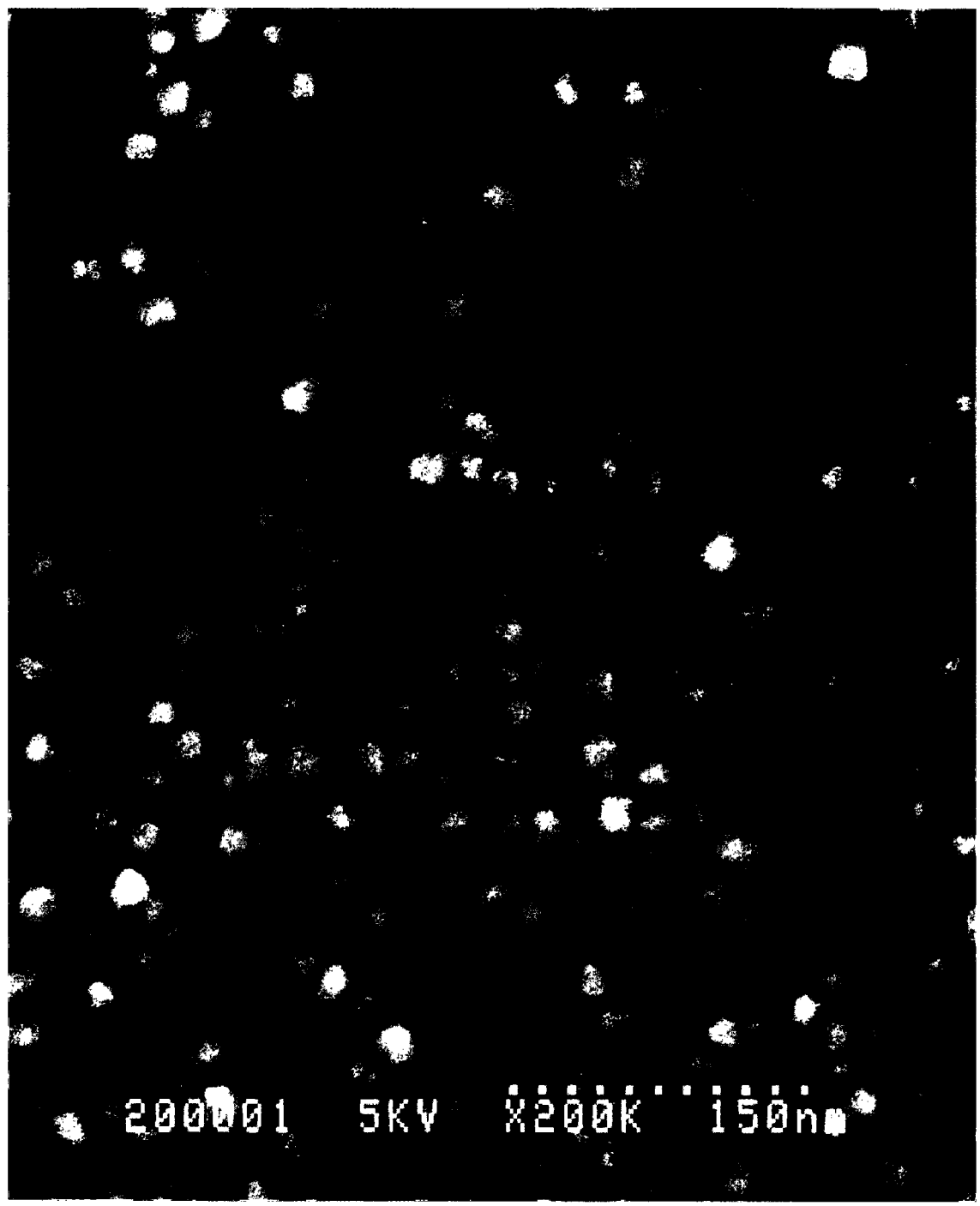
FIG. 1 is a photograph taken with an electron microscope, the photograph showing the structure of the silver particles in a film formed using the silver colloidal solution of Example 1 of the present invention.

The present invention is explained below. A metallic colloidal solution and an inkjet-use metallic ink of the present invention include (a) metallic particles that are deposited by reducing metallic ions in water and that have a primary-particle diameter of at most 200 nm, (b) a dispersant that has a molecular weight of 200 to 30,000, and (c) a dispersion medium made of a mixed solvent of water and a water-soluble organic solvent.

In the above description, the reason why the primary-particle diameter of the metallic particles is limited to at most 200 nm is explained below. Large metallic particles having a primary-particle diameter of more than 200 nm have poor dispersibility in a metallic colloidal solution. They tend to aggregate to produce secondary particles. Even when they do not aggregate, they reduce the fluidity of the metallic colloidal solution. Therefore, a metallic colloidal solution including such large metallic particles cannot have properties required for an ink to be used for various printing methods and ink-applying methods. Furthermore, when it is used as an inkjet-use metallic ink, the nozzle and another small opening tend to be clogged. In addition, the formed wiring circuit and conductive film become nonuniform in structure and conductivity due to the production of the secondary particles and other adverse causes.

On the other hand, extremely fine metallic particles having a primary-particle diameter of at most 200 nm have superior dispersibility in a metallic colloidal solution. They have no tendency to aggregate. They have increased fluidity. Consequently, as described earlier, a metallic colloidal solution of the present invention including metallic particles that have a primary-particle diameter of at most 200 nm can satisfy the requirement to have the most suitable range of properties such as viscosity, surface tension, and vapor pressure by adjusting the composition ratio of water and a water-soluble organic solvent and by selecting the type of the water-soluble organic solvent. Similarly, an inkjet-use metallic ink of the present invention can satisfy the requirement to have the most suitable range of properties for the inkjet printing method. In addition, it has no tendency to clog the nozzle or to produce other defective conditions. Furthermore, the wiring circuit and conductive film formed by using a metallic colloidal solution and an inkjet-use metallic ink of the present invention have extremely uniform structure and conductivity.

The lowest value of the primary-particle diameter of the metallic particles has no particular limitation. Theoretically, it is possible to use the particles having the minimum diameter that can have conductivity as a metal. Practically, however, it is desirable that the primary-particle diameter be at least 1 nm. In other words, it is desirable that the metallic particles have a primary-particle diameter of 1 to 200 nm.

It is desirable that the content of the metallic particles both be 0.1 to 90 wt. % of the total weight of the metallic colloidal solution and be 0.1 to 90 wt. % of the total weight of the inkjet-use metallic ink. If the content is less than 0.1 wt. %, the content is excessively small, so that it may be impossible to form a wiring circuit and a conductive film having sufficient thickness and conductivity by any of the printing methods and ink-applying methods. Conversely, if the content is more than 90 wt. %, the fluidity decreases excessively, so that it may be impossible to obtain a metallic colloidal solution and an inkjet-use metallic ink suitable for various printing methods and ink-applying methods.

It is desirable that the primary-particle diameter and the percentage content of the metallic particles be determined to fall in a range most suitable for an individual printing method and ink-applying method by selecting from the above-described range so that the most suitable properties can be achieved when a specific printing method or ink-applying method is adopted for forming a wiring circuit and a conductive film. The metallic particles may be composed of a metal selected from various metals and alloys. In particular, in view of giving good conductivity to the wiring circuit and conductive film, it is desirable that the metallic particles be composed of nickel, copper, silver, gold, platinum, palladium, or an alloy of these metals.

As the dispersant, a dispersant that has a molecular weight of 200 to 30,000 is selected from various dispersants having good solubility in water or an water-soluble organic solvent. If the molecular weight of the dispersant is less than 200, the effect of stably dispersing the metallic particles cannot be obtained. If the molecular weight is more than 30,000, in this case also, the effect of stably dispersing the metallic particles cannot be obtained. Furthermore, the dispersant having such a high molecular weight may intervene between metallic particles in the formed wiring circuit and conductive film to decrease the conductivity.

On the other hand, the dispersant having a molecular weight of 200 to 30,000 tends to have a structure known as the loop-train-tail structure. Consequently, it has an excellent effect of improving the dispersibility of the metallic particles. It has no possibility of decreasing the conductivity by intervening between metallic particles. In view of the stable dispersion of the metallic particles, it is particularly desirable that the above-described range of the molecular weight of the dispersant be narrowed to a range of 2,000 to 30,000.

Considering the prevention of the deterioration of not only the wiring circuit and conductive film but also other members such as electronic components placed in the vicinity of them, it is desirable that the dispersant be composed of an organic compound that does not contain sulfur, phosphorus, boron, or a halogen atom. The types of suitable dispersant that satisfies these requirements include an amine-based polymer dispersant such as polyethylene imine and polyvinyl pyrrolidone, a hydrocarbon-based polymer dispersant having a carboxylic acid group in the molecule such as polyacrylic acid and carboxymethyl cellulose, and poval (polyvinyl alcohol). It is also desirable to use a polymer dispersant such as a copolymer having a polyethylene imine portion and a polyethylene oxide portion in one molecule (hereinafter referred to as a PEI-PO copolymer). The polymer dispersant can act as a viscosity-adjusting agent.

It is desirable that the content of the dispersant be 2 to 30 weight parts per 100 weight parts of the metallic particles. If the content is less than 2 weight parts, it may be impossible to sufficiently obtain the dispersant-adding effect of uniformly dispersing the metallic particles in the metallic colloidal solution and the inkjet-use metallic ink. Conversely, if the content is more than 30 weight parts, the viscosity becomes excessively high. Consequently, it may be impossible to obtain (a) an metallic colloidal solution suitable for various printing methods and ink-applying methods and (b) an inkjet-use metallic ink having properties suitable for the inkjet printing method. In addition, the excess dispersant may intervene between metallic particles in the formed wiring circuit and conductive film to decrease the conductivity.

It is desirable that the molecular weight and the percentage content of the dispersant be determined to fall in a range most suitable for an individual printing method and ink-applying method by selecting from the above-described range so that the most suitable properties can be achieved when a specific printing method or ink-applying method is adopted for forming a wiring circuit and a conductive film. It is desirable that the type of the dispersant to be used be determined by selecting from the various dispersants so that the most suitable properties can be achieved when a specific printing method or ink-applying method is adopted for forming a wiring circuit and a conductive film.

As the water-soluble organic solvent, any organic solvent may be used providing that it is soluble in water and has a dielectric constant of at least 3 at 20° C. The types of the water-soluble organic solvent include alcohol such as methanol, ethanol, n-propanol, 2-propanol, t-butylalcohol, glycerin, dipropylene glycol, ethylene glycol, and polyethylene glycol; ketone such as acetone and methyl ethyl ketone; glycol ether such as ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, diethylene glycol dimethyl ether, diethylene glycol diethyl ether, triethylene glycol monobutyl ether, dipropylene glycol monomethyl ether, dipropylene glycol monoethyl ether, and tripropylene glycol monomethyl ether; a water-soluble nitrogen-containing organic compound such as 2-pyrrolidone and N-methyl pyrrolidone; and ethyl acetate. The water-soluble organic solvent can be used either singly in one type or in combination of two or more types.

In the present invention, the dispersant is determined so that the metallic colloidal solution and the inkjet-use metallic ink can have the most suitable properties for an individual printing method and ink-applying method when they are used to form a wiring circuit and a conductive film. More specifically, the dispersant is made of water and a water-soluble organic solvent, and the composition ratio of them and the type of the water-soluble organic solvent are selected properly. When two or more types of water-soluble organic solvents are combined, the combination is selected properly.

For example, when a conductive film is formed by using the spin coating method, the metallic colloidal solution is required to have low viscosity. Conversely, when a wiring circuit is produced by using the screen printing method or dispenser application method, the metallic colloidal solution is required to have high viscosity. In the screen printing method, the metallic colloidal solution is required to have high vapor pressure in order to retard the drying.

To be suitable for the piezoelectric-type inkjet printing method, it is desirable that the inkjet-use metallic ink have a surface tension of 20 to 60 mN/m at 25° C. and a viscosity of 0.5 to 40 mPa·s at 25° C. in order to improve the ink-ejecting performance of the nozzle, as explained earlier. In addition, the ink is required to have low vapor pressure to prevent a rapid increase in viscosity and rapid drying. It is desirable that the ink have a boiling point of at least 100° C., more desirably 120 to 300° C. In satisfying these property requirements, it is desirable that the water-soluble organic solvent be composed of a compound having relatively high molecular weight, such as glycol ether.

On the other hand, to be suitable for the thermal-type inkjet printing method, it is desirable that the inkjet-use metallic ink not only have a surface tension of 20 to 60 mN/m at 25° C. and a viscosity of 0.5 to 40 mPa·s at 25° C. in order to improve the ink-ejecting performance of the nozzle, as with the above-described case, but also have high vapor pressure to facilitate the generation of bubbles by the heat from the heating element. It is desirable that the ink have a boiling point of at most 150° C., more desirably 80 to 130° C. In satisfying these property requirements, it is desirable that the water-soluble organic solvent be composed of a compound having relatively low molecular weight, such as lower alcohol.

To satisfy the above-described property requirements, the composition ratio of the water and water-soluble organic solvent and the type of the water-soluble organic solvent are selected properly. In addition, when two or more types of water-soluble organic solvents are combined, the combination is selected properly. At the same time, as described above, the following items are selected: (a) the primary-particle diameter and percentage content of the metallic particles, (b) the molecular weight and percentage content of the dispersant, and (c) the type of the dispersant.

It is desirable that a metallic colloidal solution and an inkjet-use metallic ink of the present invention be produced by the following process. The starting material is a water-based metallic colloidal solution obtained by depositing metallic particles through the reduction of metallic ions in water. The final solution is obtained without undergoing a process that completely separates the metallic particles from water. More specifically, first, to achieve a specific concentration, the water-based metallic colloidal solution is concentrated by using a rotary evaporator, by applying heat, or by removing a supernatant fluid with the centrifugal separation method, for example. Then, a specific amount of water-soluble organic solvent is added to the solution to produce a metallic colloidal solution and an inkjet-use metallic ink of the present invention.

As the starting material, the water-based metallic colloidal solution can be produced through a conventional method. For example, a water-soluble metallic compound, which is the source of metallic ions, and a dispersant are dissolved in water. At the same time, a reducing agent is added to the water. The metallic ions are subjected to reduction reaction for a specific time desirably under the condition that the solution is stirred. Thus, the water-based metallic colloidal solution is produced.

The water-soluble metallic compound for supplying metallic ions may be selected as follows, although it is not limited to the following materials. In the case of silver, its types include silver nitrate (I) ($AgNO_3$) and silver methane-sulfonide ($CH_3SO_3Ag$). In particular, silver nitrate (I) is desirable. In the case of gold, its types include tetrachloroaurate (III) 4hydrate ($HAuCl_4.4H_2O$). In the case of platinum, its types include dinitrodiamine platinate (II) ($Pt(NO_2)_2(NH_3)_2$) and hexachloroplatinate (IV) 6hydrate ($H_2[PtCl_6].6H_2O$). In addition, the above-described water-soluble metallic compounds may be used after they are transformed into a complex by using ammonia, citric acid, or the like, as required.

As the reducing agent, various water-soluble reducing agents may be used. Nevertheless, it is desirable that the reducing agent have the smallest possible particle diameter. In addition, in view of the formation of uniform metallic particles, it is desirable to use a reducing agent having a weak reducing power.

The types of the reducing agent that satisfies the foregoing requirements include alcohol such as methanol, ethanol, and 2-propanol; ascorbic acid; ethylene glycol; glutathione; organic acids such as citric acid, apple acid, and tartaric acid; reducing saccharides such as glucose, galactose, mannose, fructose, sucrose, maltose, raffinose, and stachyose; and sugar alcohols such as solbitol.

The primary-particle diameter of the metallic particles can be adjusted so as to fall within the above-described range by adjusting not only the type and percentage content of the metallic compound, dispersant, and reducing agent but also the stirring rate, temperature, and time at the time the metallic compound undergoes the reduction reaction.

A metallic colloidal solution of the present invention can be used suitably as the ink for various printing methods and ink-applying methods by properly adjusting its properties. As described above, the various methods include the spin coating method for forming a conductive film and the screen printing method and dispenser application method for forming a wiring circuit. An inkjet-use metallic ink of the present invention can be used suitably for various inkjet printing methods by properly adjusting its properties. As described above, the various methods include the piezoelectric- and thermal-type inkjet printing methods for forming a wiring circuit and a conductive film.

EXAMPLE

The present invention is explained below based on Examples and Comparative examples.

(Silver Colloidal Solution)

Example 1

A silver nitrate-ammonia solution was prepared by, first, dissolving 24 grams of silver nitrate in 150 grams of pure water and, then, adding ammonia water to the liquid to adjust its pH to 11.0. Next, 12 grams of polyvinyl pyrrolidone (molecular weight: 30,000) as the dispersant was added to the silver nitrate-ammonia solution and dissolved in it. Then, 100 grams of ethylene glycol as the reducing agent was added to the solution. The solution was stirred at a stirring rate of 1,000 rpm for 180 minutes at 40° C. to cause the chemical reaction to proceed. Thus, a water-based silver colloidal solution having a yellow plasmon absorption was obtained.

Next, the obtained silver colloidal solution was centrifuged at 20,000 G for 20 minutes to remove impurities lighter than the silver particles. This removing operation was repeated. The solution was rinsed with pure water. The particle size distribution of the silver particles was measured using a particle size analyzer that applied the laser Doppler method (the analyzer: made by Nikkiso Co., Ltd. based in Japan, the brand name: Microtrac UPA150EX). The result revealed that there was a sharp peak at a position of 5 nm.

The obtained silver colloidal solution was concentrated with a rotary evaporator to reduce the water content to 20 wt. %. Acetone as the water-soluble organic solvent was added to the solution. Thus, a silver colloidal solution whose dispersion medium was a mixed solution of water and acetone was produced.

In the silver colloidal solution, the composition ratio in weight of the silver particles (Ag), the water (W), and the acetone (Ac) was obtained as Ag:W:Ac=80:20:100. The measurements of the properties showed that the silver colloidal solution had a surface tension of 32 mN/m at 25° C., a viscosity of 14 mPa·s at 25° C., and a boiling point of 62° C. An observation of the dispersibility of the silver particles in the silver colloidal solution showed that when the solution was maintained stationary for two months, no precipitation occurred, which means the result was excellent. Its particle size distribution was measured using the above-described particle size analyzer. The result showed that there was a sharp peak at a position of 5 nm. This result confirmed that the addition of acetone after the concentrating operation did not vary the particle size distribution.

In addition, the silver colloidal solution was applied onto a glass substrate. The formed film was dried and then observed with a scanning electron microscope. As shown in FIG. 1, the observation confirmed that the formed film had a uniform structure composed of a number of silver particles having a uniform particle diameter and shape.

Example 2

A water-based silver colloidal solution was obtained through a method similar to that used in Example 1 except that 12 grams of polyvinyl pyrrolidone having a molecular weight of 25,000 was used as the dispersant.

The obtained silver colloidal solution was centrifuged at 20,000 G for 20 minutes to remove impurities lighter than the silver particles. This removing operation was repeated. The solution was rinsed with pure water. The particle size distribution of the silver particles was measured using the above-described particle size analyzer. The result revealed that there was a sharp peak at a position of 12 nm.

Next, the obtained silver colloidal solution was concentrated with a rotary evaporator to reduce the water content to 20 wt. %. Glycerin as the water-soluble organic solvent was added to the solution. Thus, a silver colloidal solution whose dispersion medium was a mixed solution of water and glycerin was produced.

In the silver colloidal solution, the composition ratio in weight of the silver particles (Ag), the water (W), and the glycerin (Gl) was obtained as Ag:W:Gl=80:20:200. The measurements of the properties showed that the silver colloidal solution had a surface tension of 55 mN/m at 25° C., a viscosity of 850 mPa·s at 25° C., and a boiling point of 270° C. An observation of the dispersibility of the silver particles in the silver colloidal solution showed that when the solution was maintained stationary for two months, no precipitation occurred, which means the result was excellent. Its particle size distribution was measured using the above-described particle size analyzer. The result showed that there was a sharp peak at a position of 12 nm. This result confirmed that the addition of glycerin after the concentrating operation did not vary the particle size distribution.

Example 3

A water-based silver colloidal solution was obtained through a method similar to that used in Example 1 except that the amount of the silver nitrate was changed to 48 grams, the amount of the polyvinyl pyrrolidone (molecular weight: 30,000) as the dispersant was changed to 24 grams, and 50 grams of citric acid was used as the reducing agent.

The obtained silver colloidal solution was centrifuged at 20,000 G for 20 minutes to remove impurities lighter than the silver particles. This removing operation was repeated. The solution was rinsed with pure water. The particle size distribution of the silver particles was measured using the above-described particle size analyzer. The result revealed that there was a sharp peak at a position of 22 nm.

Next, the obtained silver colloidal solution was concentrated by heating it at 60° C. to reduce the water content to 1 wt. %. Ethanol as the water-soluble organic solvent was added to the solution. Thus, a silver colloidal solution whose dispersion medium was a mixed solution of water and ethanol was produced.

In the silver colloidal solution, the composition ratio in weight of the silver particles (Ag), the water (W), and the ethanol (Et) was obtained as Ag:W:Et=99:1:200. The measurements of the properties showed that the silver colloidal solution had a surface tension of 24 mN/m at 25° C., a viscosity of 5 mPa·s at 25° C., and a boiling point of 82° C. An observation of the dispersibility of the silver particles in the silver colloidal solution showed that when the solution was maintained stationary for two months, no precipitation occurred, which means the result was excellent. Its particle size distribution was measured using the above-described particle size analyzer. The result showed that there was a sharp peak at a position of 22 nm. This result confirmed that the addition of ethanol after the concentrating operation did not vary the particle size distribution.

Example 4

A water-based silver colloidal solution was obtained through a method similar to that used in Example 1 except that the amount of the silver nitrate was changed to 48 grams, the amount of the polyvinyl pyrrolidone (molecular weight: 30,000) as the dispersant was changed to 30 grams, and the amount of the ethylene glycol as the reducing agent was changed to 250 grams.

The obtained silver colloidal solution was electrodialyzed using an ultrafiltration membrane to remove impurities. The solution was rinsed with pure water. The particle size distribution of the silver particles was measured using the above-described particle size analyzer. The result revealed that there was a sharp peak at a position of 5 nm.

Next, the obtained silver colloidal solution was concentrated by heating it at 60° C. to reduce the water content to 5 wt. %. Ethylene glycol monobutyl ether and glycerin both as the water-soluble organic solvent were added to the solution. Thus, a silver colloidal solution whose dispersion medium was a mixed solution of water, ethylene glycol monobutyl ether, and glycerin was produced.

In the silver colloidal solution, the composition ratio in weight of the silver particles (Ag), the water (W), the ethylene glycol monobutyl ether (EG), and the glycerin (Gl) was obtained as Ag:W:EG:Gl=95:5:400:10. The measurements of the properties showed that the silver colloidal solution had a surface tension of 33 mN/m at 25° C., a viscosity of 18 mPa·s at 25° C., and a boiling point of 250° C. An observation of the dispersibility of the silver particles in the silver colloidal solution showed that when the solution was maintained stationary for two months, no precipitation occurred, which means the result was excellent. Its particle size distribution was measured using the above-described particle size analyzer. The result showed that there was a sharp peak at a position of 5 nm. This result confirmed that the addition of ethylene glycol monobutyl ether and glycerin after the concentrating operation did not vary the particle size distribution.

Example 5

A water-based silver colloidal solution was obtained through a method similar to that used in Example 1 except that the amount of the silver nitrate was changed to three grams, two grams of polyacrylic acid having a molecular weight of 5,000 was used as the dispersant, and eight grams of citric acid was used as the reducing agent.

The obtained silver colloidal solution was centrifuged at 20,000 G for 20 minutes to remove impurities lighter than the silver particles. This removing operation was repeated. The solution was rinsed with pure water. The particle size distribution of the silver particles was measured using the above-described particle size analyzer. The result revealed that there was a sharp peak at a position of 31 nm.

Next, the obtained silver colloidal solution was concentrated by centrifuging it at 10,000 rpm and then removing the supernatant fluid to reduce the water content to 12 wt. %. Then, 2-propanol as the water-soluble organic solvent was added to the solution. Thus, a silver colloidal solution whose dispersion medium was a mixed solution of water and 2-propanol was produced.

In the silver colloidal solution, the composition ratio in weight of the silver particles (Ag), the water (W), and the 2-propanol (Pr) was obtained as Ag:W:Pr=88:12:100. The measurements of the properties showed that the silver colloidal solution had a surface tension of 35 mN/m at 25° C., a viscosity of 10 mPa·s at 25° C., and a boiling point of 95° C. An observation of the dispersibility of the silver particles in the silver colloidal solution showed that when the solution was maintained stationary for two months, no precipitation occurred, which means the result was excellent. Its particle size distribution was measured using the above-described particle size analyzer. The result showed that there was a sharp peak at a position of 31 nm. This result confirmed that the addition of 2-propanol after the concentrating operation did not vary the particle size distribution.

Example 6

A water-based silver colloidal solution was obtained through a method similar to that used in Example 1 except that the amount of the silver nitrate was changed to 12 grams, 30 grams of poval having a molecular weight of 2,000 was used as the dispersant, 26 grams of glucose was used as the reducing agent, the reaction temperature was changed to 60° C., and the reaction time was changed to 60 minutes.

The obtained silver colloidal solution was electrodialyzed using an ultrafiltration membrane to remove impurities. The solution was rinsed with pure water. The particle size distribution of the silver particles was measured using the above-described particle size analyzer. The result revealed that there was a sharp peak at a position of 10 nm.

Next, the obtained silver colloidal solution was concentrated by heating it at 60° C. to reduce the water content to 8 wt. %. Then, 2-ethoxyethanol and 2-pyrrolidone both as the water-soluble organic solvent were added to the solution. Thus, a silver colloidal solution whose dispersion medium was a mixed solution of water, 2-ethoxyethanol, and 2-pyrrolidone was produced.

In the silver colloidal solution, the composition ratio in weight of the silver particles (Ag), the water (W), the 2-ethoxyethanol (EE), and the 2-pyrrolidone (Py) was obtained as Ag:W:EE:Py=92:8:150:40. The measurements of the properties showed that the silver colloidal solution had a surface tension of 30 mN/m at 25° C., a viscosity of 19 mPa·s at 25° C., and a boiling point of 190° C. An observation of the dispersibility of the silver particles in the silver colloidal solution showed that when the solution was maintained stationary for two months, no precipitation occurred, which means the result was excellent. Its particle size distribution was measured using the above-described particle size analyzer. The result showed that there was a sharp peak at a position of 10 nm. This result confirmed that the addition of 2-ethoxyethanol and 2-pyrrolidone after the concentrating operation did not vary the particle size distribution.

Comparative Example 1

The water-based silver colloidal solution that was obtained in Example 1 and that had a sharp peak at a position of 5 nm was heated at 60° C. to evaporate the water and remove it completely. Thus, the silver particles were separated from water completely. Acetone was added to the particles to produce a silver colloidal solution whose dispersion medium was acetone.

In the silver colloidal solution, the composition ratio in weight of the silver particles (Ag) and the acetone (Ac) was obtained as Ag:Ac=15:85. The measurements of the properties showed that the silver colloidal solution had a surface tension of 25 mN/m at 25° C., a viscosity of 1 mPa·s at 25° C., and a boiling point of 58° C. An observation of the dispersibility of the silver particles in the silver colloidal solution showed that when the solution was maintained stationary for one day, precipitation of silver particles occurred, which means the dispersibility was unsatisfactory. The particle size distribution of the silver particles was measured using the above-described particle size analyzer. The result revealed that there was a peak at a position of 250 nm. This result explained that the addition of acetone after the complete separation of the silver particles from the water caused silver particles to aggregate, so that the particle size distribution varied greatly.

Comparative Example 2

A silver colloidal solution whose dispersion medium was made of water and toluene was produced through a method similar to that used in Example 1 except the following points. After the completion of the reaction, the water-based silver colloidal solution was centrifuged, rinsed, and subjected to the measurement of particle size distribution. The solution was concentrated by centrifuging it at 10,000 rpm and then removing the supernatant fluid to reduce the water content to 10 wt. %. Then, toluene, which is a water-insoluble organic solvent, was added to the solution. However, it was impossible to obtain a uniform silver colloidal solution, because the solution separated into two types of liquids. The solution had a boiling point of 120° C.

Comparative Example 3

A water-based silver colloidal solution was obtained through a method similar to that used in Example 1 except that 25 grams of citric acid was used as the reducing agent.

The obtained silver colloidal solution was centrifuged at 20,000 G for 20 minutes to remove impurities lighter than the silver particles. This removing operation was repeated. The solution was rinsed with pure water. The particle size distribution of the silver particles was measured using the above-described particle size analyzer. The result revealed that there was a sharp peak at a position of 22 nm.

Next, the obtained silver colloidal solution was heated at 60° C. to evaporate the water and remove it completely. Thus, the silver particles were separated from water completely. Then, 2-propanol was added to the particles to produce a silver colloidal solution whose dispersion medium was 2-propanol.

In the silver colloidal solution, the composition ratio in weight of the silver particles (Ag) and the 2-propanol (Pr) was obtained as Ag:Pr=100:100. The measurements of the properties showed that the silver colloidal solution had a surface tension of 28 mN/m at 25° C., a viscosity of 5 mPa·s at 25° C., and a boiling point of 88° C. An observation of the dispersibility of the silver particles in the silver colloidal solution showed that when the solution was maintained stationary for one day, precipitation of silver particles occurred, which means the dispersibility was unsatisfactory. The particle size distribution of the silver particles was measured using the above-described particle size analyzer. The result showed that there was a peak at a position of 1,500 nm. This result explained that the addition of 2-propanol after the complete separation of the silver particles from the water caused silver particles to aggregate, so that the particle size distribution varied greatly.

(Gold Colloidal Solution)

Example 7

First, 40 grams of tetrachloroaurate (III) 4hydrate was dissolved in 200 grams of pure water. Second, 12 grams of polyvinyl pyrrolidone (molecular weight: 25,000) as the dispersant was added to the solution and dissolved in it completely. Third, 10 grams of apple acid as the reducing agent was added to the gold chloride solution. The solution was stirred at a stirring rate of 1,000 rpm for 60 minutes at 25° C. to cause the chemical reaction to proceed. Thus, a water-based gold colloidal solution having a reddish-purple plasmon absorption was obtained.

Next, the obtained gold colloidal solution was centrifuged at 20,000 G for 20 minutes to remove impurities lighter than the gold particles. This removing operation was repeated. The solution was rinsed with pure water. The particle size distribution of the gold particles was measured using the above-described particle size analyzer. The result revealed that there was a sharp peak at a position of 20 nm.

The obtained gold colloidal solution was concentrated by centrifuging it at 10,000 rpm and then removing the supernatant fluid to reduce the water content to 15 wt. %. Dipropylene glycol as the water-soluble organic solvent was added to the solution. Thus, a gold colloidal solution whose dispersion medium was a mixed solution of water and dipropylene glycol was produced.

In the gold colloidal solution, the composition ratio in weight of the gold particles (Au), the water (W), and the dipropylene glycol (DPG) was obtained as Au:W:DPG=85:15:200. The measurements of the properties showed that the gold colloidal solution had a surface tension of 40 mN/m at 25° C., a viscosity of 85 mPa·s at 25° C., and a boiling point of 210° C. An observation of the dispersibility of the gold particles in the gold colloidal solution showed that when the solution was maintained stationary for two months, no precipitation occurred, which means the result was excellent. Its particle size distribution was measured using the above-described particle size analyzer. The result showed that there was a sharp peak at a position of 20 nm. This result confirmed that the addition of dipropylene glycol after the concentrating operation did not vary the particle size distribution.

Example 8

The water-based gold colloidal solution that was obtained in Example 7 and that had a sharp peak at a position of 20 nm was concentrated with a rotary evaporator to reduce the water content to 25 wt. %. Ethyl acetate as the water-soluble organic solvent was added to the solution. Thus, a gold colloidal solution whose dispersion medium was a mixed solution of water and ethyl acetate was produced.

In the gold colloidal solution, the composition ratio in weight of the gold particles (Au), the water (W), and the ethyl acetate (EAc) was obtained as Au:W:EAc=75:25:200. The measurements of the properties showed that the gold colloidal solution had a surface tension of 28 mN/m at 25° C., a viscosity of 2 mPa·s at 25° C., and a boiling point of 88° C. An observation of the dispersibility of the gold particles in the gold colloidal solution showed that when the solution was maintained stationary for two months, no precipitation occurred, which means the result was excellent. Its particle size distribution was measured using the above-described particle size analyzer. The result showed that there was a sharp peak at a position of 20 nm. This result confirmed that the addition of ethyl acetate after the concentrating operation did not vary the particle size distribution.

Comparative Example 4

The water-based gold colloidal solution that was obtained in Example 7 and that had a sharp peak at a position of 20 nm was heated at 60° C. to evaporate the water and remove it completely. Thus, the gold particles were separated from water completely. Ethanol was added to the particles to produce a gold colloidal solution whose dispersion medium was ethanol.

In the gold colloidal solution, the composition ratio in weight of the gold particles (Au) and the ethanol (Et) was obtained as Au:Et=100:200. The measurements of the properties showed that the gold colloidal solution had a surface tension of 23 mN/m at 25° C., a viscosity of 3 mPa·s at 25° C., and a boiling point of 85° C.

An observation of the dispersibility of the gold particles in the gold colloidal solution showed that when the solution was maintained stationary for one day, precipitation of gold particles occurred, which means the dispersibility was unsatisfactory. The particle size distribution of the gold particles was measured using the above-described particle size analyzer. The result revealed that there was a peak at a position of 350 nm. This result explained that the addition of ethanol after the complete separation of the gold particles from the water caused gold particles to aggregate, so that the particle size distribution varied greatly.

(Platinum Colloidal Solution)

Example 9

First, 45 grams of hexachloroplatinate (IV) 6hydrate was dissolved in 200 grams of pure water. Second, eight grams of polyacrylic acid (molecular weight: 5,000) as the dispersant was added to the solution and dissolved in it completely. Third, 80 grams of ethanol as the reducing agent was added to the platinum chloride solution. The solution was stirred at a stirring rate of 1,000 rpm for 360 minutes at 50° C. to cause the chemical reaction to proceed. Thus, a water-based platinum colloidal solution having a black color was obtained.

Next, the obtained platinum colloidal solution was electrodialyzed using an ultrafiltration membrane to remove impurities. The solution was rinsed with pure water. The particle size distribution of the platinum particles was measured using the above-described particle size analyzer. The result revealed that there was a sharp peak at a position of 3 nm.

The obtained platinum colloidal solution was concentrated by heating it at 60° C. to reduce the water content to 5 wt. %. Acetone and glycerin both as the water-soluble organic solvent were added to the solution. Thus, a platinum colloidal solution whose dispersion medium was a mixed solution of water, acetone, and glycerin was produced.

In the platinum colloidal solution, the composition ratio in weight of the platinum particles (Pt), the water (W), the acetone (Ac), and the glycerin (Gl) was obtained as Pt:W:Ac:Gl=95:5:80:10. The measurements of the properties showed that the platinum colloidal solution had a surface tension of 30 mN/m at 25° C., a viscosity of 16 mPa·s at 25° C., and a boiling point of 81° C. An observation of the dispersibility of the platinum particles in the platinum colloidal solution showed that when the solution was maintained stationary for two months, no precipitation occurred, which means the result was excellent. Its particle size distribution was measured using the above-described particle size analyzer. The result showed that there was a sharp peak at a position of 3 nm. This result confirmed that the addition of acetone and glycerin after the concentrating operation did not vary the particle size distribution.

Example 10

A water-based platinum colloidal solution was obtained through a method similar to that used in Example 9 except that 35 grams of poval having a molecular weight of 2,000 was used as the dispersant, 100 grams of ethylene glycol was used as the reducing agent, the reaction temperature was changed to 80° C., and the reaction time was changed to 180 minutes.

The obtained platinum colloidal solution was centrifuged at 20,000 G for 20 minutes to remove impurities lighter than the platinum particles. This removing operation was repeated. The solution was rinsed with pure water. The particle size distribution of the platinum particles was measured using the above-described particle size analyzer. The result revealed that there was a sharp peak at a position of 10 nm.

Next, the obtained platinum colloidal solution was concentrated using a rotary evaporator to reduce the water content to 15 wt. %. Then, tripropylene glycol monomethyl ether as the water-soluble organic solvent was added to the solution. Thus, a platinum colloidal solution whose dispersion medium was a mixed solution of water and tripropylene glycol monomethyl ether was produced.

In the platinum colloidal solution, the composition ratio in weight of the platinum particles (Pt), the water (W), and the tripropylene glycol monomethyl ether (TPG) was obtained as Pt:W:TPG=85:15:400. The measurements of the properties showed that the platinum colloidal solution had a surface tension of 35 mN/m at 25° C., a viscosity of 10 mPa·s at 25° C., and a boiling point of 220° C. An observation of the dispersibility of the platinum particles in the platinum colloidal solution showed that when the solution was maintained stationary for two months, no precipitation occurred, which means the result was excellent. Its particle size distribution was measured using the above-described particle size analyzer. The result showed that there was a sharp peak at a position of 10 nm. This result confirmed that the addition of tripropylene glycol monomethyl ether after the concentrating operation did not vary the particle size distribution.

Comparative Example 5

The water-based platinum colloidal solution that was obtained in Example 10 and that had a sharp peak at a position of 10 nm was treated with a rotary evaporator to evaporate the water and remove it completely. Thus, the platinum particles were separated from water completely. Then, tetradecane, which is a water-insoluble organic solvent, was added to the particles to produce a platinum colloidal solution. However, it was impossible to obtain a uniform platinum colloidal solution, because the solution separated into two types of liquids. The solution had a boiling point of 240° C.

(Inkjet-use Silver Ink)

Example 11

A silver nitrate-ammonia solution was prepared by, first, dissolving 26 grams of silver nitrate in 200 grams of pure water and, then, adding ammonia water to the liquid to adjust its pH to 11.0. Next, 12 grams of polyvinyl pyrrolidone (molecular weight: 30,000) as the dispersant was added to the silver nitrate-ammonia solution and dissolved in it. Then, 100 grams of ethylene glycol as the reducing agent was added to the solution. The solution was stirred at a stirring rate of 1,000 rpm for 180 minutes at 10° C. to cause the chemical reaction to proceed. Thus, a water-based silver colloidal solution having a yellow plasmon absorption was obtained.

Next, the obtained silver colloidal solution was centrifuged at 20,000 G for 20 minutes to remove impurities lighter than the silver particles. This removing operation was repeated. The solution was rinsed with pure water. The particle size distribution of the silver particles was measured using a particle size analyzer that applied the laser Doppler method (the analyzer: made by Nikkiso Co., Ltd., the brand name: Microtrac UPA150EX). The result revealed that there was a sharp peak at a position of 5 nm.

The obtained silver colloidal solution was concentrated with a rotary evaporator to reduce the water content to 20 wt. %. Ethylene glycol monobutyl ether and glycerin both as the water-soluble organic solvent were added to the solution. Then, the solution was stirred with a magnetic stirrer until the added solvents were completely dispersed in the solution. The solution was concentrated by heating it until the concentration of the silver particles reached 30 wt. %. Thus, an inkjet-use silver ink whose dispersion medium was a mixed solution of water, ethylene glycol monobutyl ether, and glycerin was produced.

In the inkjet-use silver ink, the composition ratio in weight of the silver particles (Ag), the water (W), the ethylene glycol monobutyl ether (EGB), and the glycerin (Gl) was obtained as Ag:W:EGB:Gl=30:5:60:5. The measurements of the properties showed that the inkjet-use silver ink had a surface tension of 33 mN/m at 25° C., a viscosity of 16 mPa·s at 25° C., and a boiling point of 220° C. The particle size distribution of the silver particles in the inkjet-use silver ink was measured using the above-described particle size analyzer. The result showed that there was a sharp peak at a position of 5 nm. This result confirmed that the implementation of the production process of the inkjet-use silver ink did not vary the particle size distribution.

The inkjet-use silver ink was used for a one-hour continuous printing using a piezoelectric-type inkjet printer. The ink-ejecting stability was satisfactory without developing any faulty ejection such as the clogging at the nozzle of the printer. In addition, the inkjet-use silver ink was printed on the surface of a glass substrate using a piezoelectric-type inkjet printer. The printed figure was baked at 300° C. for 30 minutes in the atmosphere. Thus, a wiring circuit was formed that had a line width of L and a spacing of S expressed as L/S=50 μm/50 μm. The thickness of the wiring circuit was measured using a surface roughness tester (made by Tokyo Seimitsu Co., Ltd. based in Japan). The result was 0.3 μm. The wiring circuit had a resistivity of $2.2 \times 10^{-6}$ Ω·cm.

Figure 2:
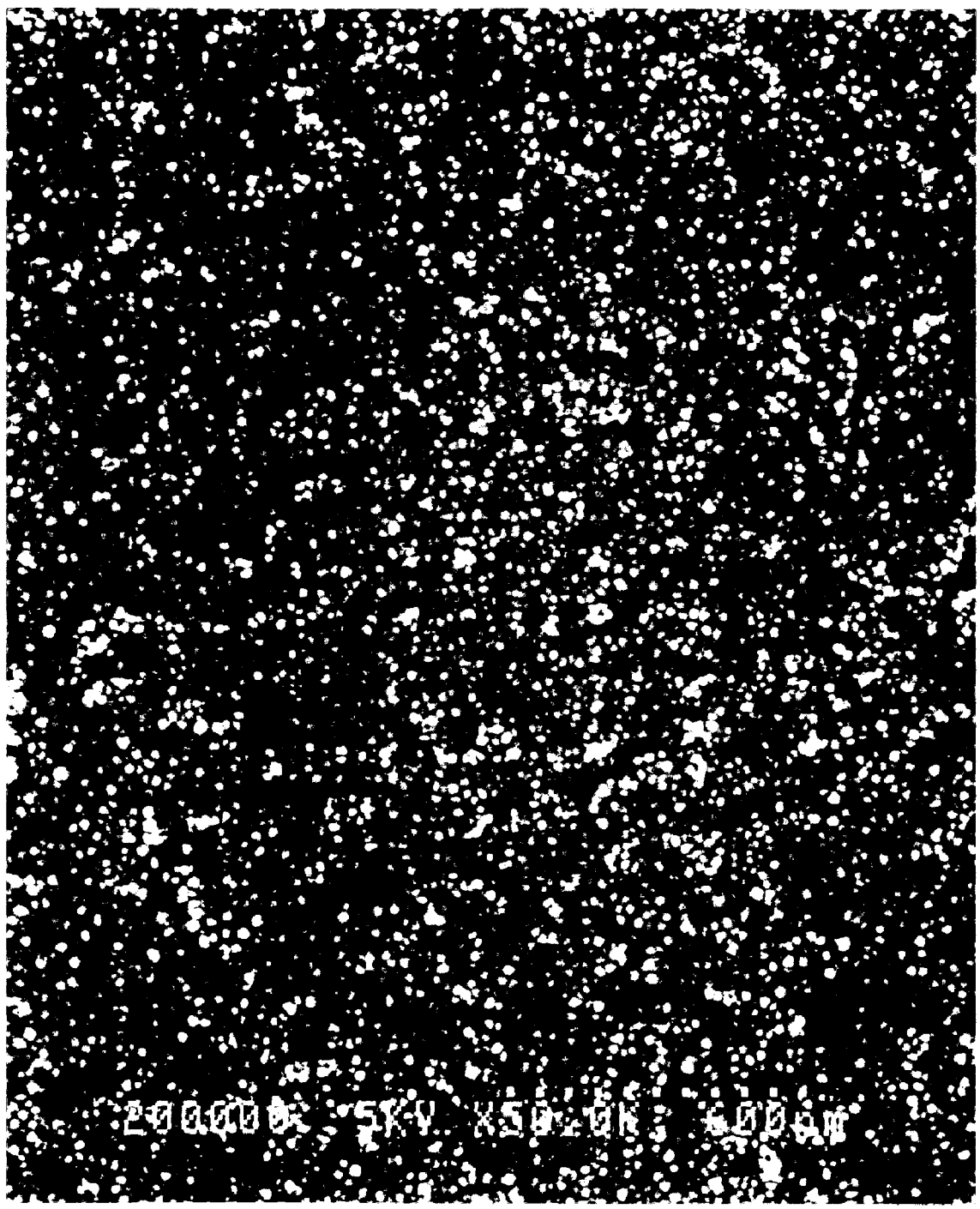
FIG. 2 is a photograph taken with an electron microscope, the photograph showing the structure of the silver particles in the printed figure formed by using the inkjet-use silver ink of Example 11 of the present invention, the photograph being taken before the baking of the printed figure.
Figure 3:
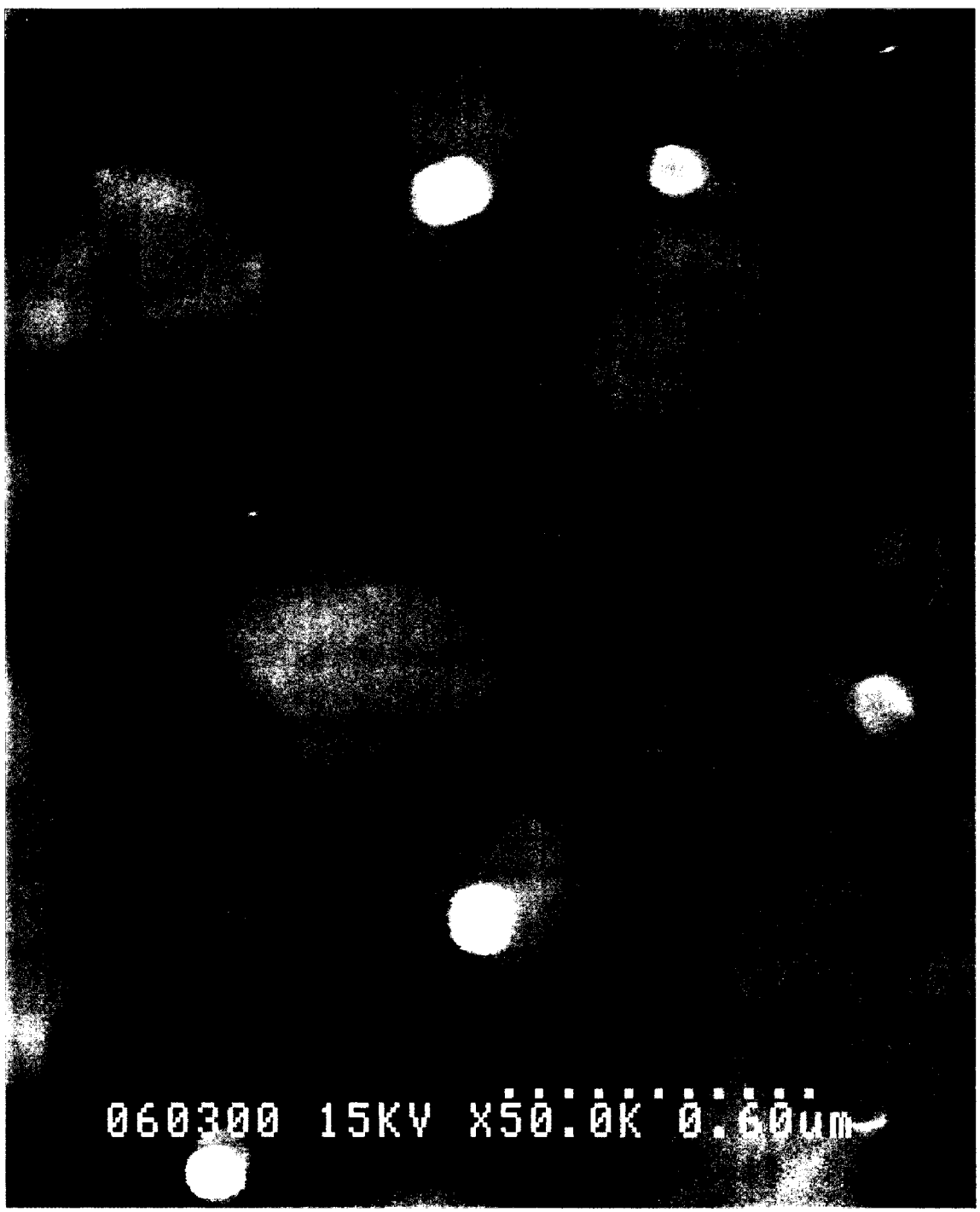
FIG. 3 is a photograph taken with an electron microscope, the photograph showing the structure of the film forming a wiring circuit formed by baking the printed figure shown in FIG. 2, the film being formed by the consolidation of molten silver particles.

Before the baking, the printed figure on the glass substrate was observed with a scanning electron microscope. As shown in FIG. 2, the observation confirmed that the printed figure had a uniform structure composed of a number of silver particles having a uniform particle diameter and shape. Similarly, the wiring circuit formed by baking the printed figure was also observed with a scanning electron microscope. As shown in FIG. 3, the observation confirmed that the film forming the wiring circuit had a structure in which a number of molten silver particles were consolidated continuously and neatly.

Example 12

A silver nitrate-ammonia solution was prepared by, first, dissolving 26 grams of silver nitrate in 300 grams of pure water and, then, adding ammonia gas to the liquid to adjust its pH to 11.3. Next, 16 grams of polyacrylic acid (molecular weight: 5,000) as the dispersant was added to the silver nitrate-ammonia solution and dissolved in it. Then, 22 grams of ascorbic acid as the reducing agent was added to the solution. The solution was stirred at a stirring rate of 1,000 rpm for five minutes at 5° C. to cause the chemical reaction to proceed. Thus, a water-based silver colloidal solution having a yellow plasmon absorption was obtained.

Next, the obtained silver colloidal solution was electrodialyzed using an ultrafiltration membrane to remove impurities. The solution was rinsed with pure water. The particle size distribution of the silver particles was measured using the above-described particle size analyzer. The result revealed that there was a sharp peak at a position of 15 nm.

The obtained silver colloidal solution was concentrated by heating it at 70° C. to reduce the water content to 5 wt. %. Then, 2-butoxyethanol and polyethylene glycol (average molecular weight: 200) both as the water-soluble organic solvent were added to the solution. The solution was stirred with a magnetic stirrer until the added solvents were completely dispersed in the solution. The solution was concentrated by heating it until the concentration of the silver particles reached 30 wt. %. Thus, an inkjet-use silver ink whose dispersion medium was a mixed solution of water, 2-butoxyethanol, and polyethylene glycol was produced.

In the inkjet-use silver ink, the composition ratio in weight of the silver particles (Ag), the water (W), the 2-butoxyethanol (BE), and the polyethylene glycol (PEG) was obtained as Ag:W:BE:PEG=30:1:65:4. The measurements of the properties showed that the inkjet-use silver ink had a surface tension of 30 mN/m at 25° C., a viscosity of 15 mPa·s at 25° C., and a boiling point of 150° C. The particle size distribution of the silver particles in the inkjet-use silver ink was measured using the above-described particle size analyzer. The result showed that there was a sharp peak at a position of 15 nm. This result confirmed that the implementation of the production process of the inkjet-use silver ink did not vary the particle size distribution.

The inkjet-use silver ink was used for a one-hour continuous printing using a piezoelectric-type inkjet printer. The ink-ejecting stability was satisfactory without developing any faulty ejection such as the clogging at the nozzle of the printer. In addition, the inkjet-use silver ink was printed on the surface of a glass substrate using a piezoelectric-type inkjet printer. The printed figure was baked at 200° C. for 30 minutes in the atmosphere. Thus, a wiring circuit was formed that had a line width of L and a spacing of S expressed as L/S=50 μm/50 μm. The thickness of the wiring circuit was measured using a surface roughness tester (made by Tokyo Seimitsu Co., Ltd.). The result was 0.3 μm. The wiring circuit had a resistivity of $2.2 \times 10^{-6}$ Ω·cm.

Example 13

A water-based silver colloidal solution was obtained through a method similar to that used in Example 12 except that the amount of the silver nitrate was changed to four grams, two grams of polyethylene imine (molecular weight: 600) was used as the dispersant, four grams of titanium trichloride was used as the reducing agent, the reaction temperature was changed to 25° C., and the reaction time was changed to 30 minutes.

Next, the obtained silver colloidal solution was electrodialyzed using an ultrafiltration membrane to remove impurities. The solution was rinsed with pure water. The particle size distribution of the silver particles was measured using the above-described particle size analyzer. The result revealed that there was a sharp peak at a position of 8 nm.

The obtained silver colloidal solution was concentrated using a rotary evaporator to reduce the water content to 15 wt. %. Ethylene glycol as the water-soluble organic solvent was added to the solution. Then, the solution was stirred with a magnetic stirrer until the added solvent was completely dispersed in the solution. The solution was concentrated by heating it until the concentration of the silver particles reached 25 wt. %. Thus, an inkjet-use silver ink whose dispersion medium was a mixed solution of water and ethylene glycol was produced.

In the inkjet-use silver ink, the composition ratio in weight of the silver particles (Ag), the water (W), and the ethylene glycol (EG) was obtained as Ag:W:EG=25:2:73. The measurements of the properties showed that the inkjet-use silver ink had a surface tension of 45 mN/m at 25° C., a viscosity of 19 mPa·s at 25° C., and a boiling point of 185° C. The particle size distribution of the silver particles in the inkjet-use silver ink was measured using the above-described particle size analyzer. The result showed that there was a sharp peak at a position of 8 nm. This result confirmed that the implementation of the production process of the inkjet-use silver ink did not vary the particle size distribution.

The inkjet-use silver ink was used for a one-hour continuous printing using a piezoelectric-type inkjet printer. The ink-ejecting stability was satisfactory without developing any faulty ejection such as the clogging at the nozzle of the printer. In addition, the inkjet-use silver ink was printed on the surface of a glass substrate using a piezoelectric-type inkjet printer. The printed figure was baked at 400° C. for 15 minutes in the atmosphere. Thus, a wiring circuit was formed that had a line width of L and a spacing of S expressed as L/S=100 μm/100 μm. The thickness of the wiring circuit was measured using a surface roughness tester (made by Tokyo Seimitsu Co., Ltd.). The result was 0.2 μm. The wiring circuit had a resistivity of $1.8 \times 10^{-6}$ Ω·cm.

Example 14

A water-based silver colloidal solution was obtained through a method similar to that used in Example 12 except that 12 grams of polyethylene imine (molecular weight: 10,000) was used as the dispersant, 20 grams of fructose was used as the reducing agent, the reaction temperature was changed to 15° C., and the reaction time was changed to 120 minutes.

Next, the obtained silver colloidal solution was centrifuged at 20,000 G for 20 minutes to remove impurities lighter than the silver particles. This removing operation was repeated. The solution was rinsed with pure water. The particle size distribution of the silver particles was measured using the above-described particle size analyzer. The result revealed that there was a sharp peak at a position of 30 nm.

The obtained silver colloidal solution was concentrated by heating it at 70° C. to reduce the water content to 3 wt. %. Then, 2-ethoxyethanol and glycerin both as the water-soluble organic solvent were added to the solution. The solution was stirred with a magnetic stirrer until the added solvents were completely dispersed in the solution. The solution was concentrated by heating it until the concentration of the silver particles reached 40 wt. %. Thus, an inkjet-use silver ink whose dispersion medium was a mixed solution of water, 2-ethoxyethanol, and glycerin was produced.

In the inkjet-use silver ink, the composition ratio in weight of the silver particles (Ag), the water (W), and the 2-ethoxyethanol (EE) and the glycerin (Gl) was obtained as Ag:W:EE:Gl=40:1:55:4. The measurements of the properties showed that the inkjet-use silver ink had a surface tension of 32 mN/m at 25° C., a viscosity of 14 mPa·s at 25° C., and a boiling point of 200° C. The particle size distribution of the silver particles in the inkjet-use silver ink was measured using the above-described particle size analyzer. The result showed that there was a sharp peak at a position of 30 nm. This result confirmed that the implementation of the production process of the inkjet-use silver ink did not vary the particle size distribution.

The inkjet-use silver ink was used for a one-hour continuous printing using a piezoelectric-type inkjet printer. The ink-ejecting stability was satisfactory without developing any faulty ejection such as the clogging at the nozzle of the printer. In addition, the inkjet-use silver ink was printed on the surface of a synthetic-resin substrate using a piezoelectric-type inkjet printer. The printed figure was baked at 180° C. for 60 minutes in the atmosphere. Thus, a wiring circuit was formed that had a line width of L and a spacing of S expressed as L/S=30 μm/30 μm. The thickness of the wiring circuit was measured using a surface roughness tester (made by Tokyo Seimitsu Co., Ltd.). The result was 0.5 μm. The wiring circuit had a resistivity of $4.0 \times 10^{-6}$ Ω·cm.

Example 15

A silver nitrate-ammonia solution was prepared by, first, dissolving 52 grams of silver nitrate in 200 grams of pure water and, then, adding ammonia water to the liquid to adjust its pH to 12.0. Next, 25 grams of polyvinyl pyrrolidone (molecular weight: 30,000) as the dispersant was added to the silver nitrate-ammonia solution and dissolved in it. Then, 100 grams of 2-propanol as the reducing agent was added to the solution. The solution was stirred at a stirring rate of 1,000 rpm for 60 minutes at 40° C. to cause the chemical reaction to proceed. Thus, a water-based silver colloidal solution having a yellow plasmon absorption was obtained.

Next, the obtained silver colloidal solution was centrifuged at 20,000 G for 20 minutes to remove impurities lighter than the silver particles. This removing operation was repeated. The solution was rinsed with pure water. The particle size distribution of the silver particles was measured using the above-described particle size analyzer. The result revealed that there was a sharp peak at a position of 5 nm.

The obtained silver colloidal solution was concentrated using a rotary evaporator to reduce the water content to 22 wt. %. Then, 2-ethoxyethanol and 2-pyrrolidone both as the water-soluble organic solvent were added to the solution. The solution was stirred with a magnetic stirrer until the added solvents were completely dispersed in the solution. The solution was concentrated by heating it until the concentration of the silver particles reached 30 wt. %. Thus, an inkjet-use silver ink whose dispersion medium was a mixed solution of water, 2-ethoxyethanol, and 2-pyrrolidone was produced.

In the inkjet-use silver ink, the composition ratio in weight of the silver particles (Ag), the water (W), the 2-ethoxyethanol (EE), and the 2-pyrrolidone (Py) was obtained as Ag:W:EE:Py=30:5:60:5. The measurements of the properties showed that the inkjet-use silver ink had a surface tension of 32 mN/m at 25° C., a viscosity of 8 mPa·s at 25° C., and a boiling point of 195° C. The particle size distribution of the silver particles in the inkjet-use silver ink was measured using the above-described particle size analyzer. The result showed that there was a sharp peak at a position of 5 nm. This result confirmed that the implementation of the production process of the inkjet-use silver ink did not vary the particle size distribution.

The inkjet-use silver ink was used for a one-hour continuous printing using a piezoelectric-type inkjet printer. The ink-ejecting stability was satisfactory without developing any faulty ejection such as the clogging at the nozzle of the printer. In addition, the inkjet-use silver ink was printed on the surface of a synthetic-resin substrate using a piezoelectric-type inkjet printer. The printed figure was baked at 200° C. for 30 minutes in the atmosphere. Thus, a wiring circuit was formed that had a line width of L and a spacing of S expressed as L/S=80 μm/80 μm. The thickness of the wiring circuit was measured using a surface roughness tester (made by Tokyo Seimitsu Co., Ltd.). The result was 0.3 μm. The wiring circuit had a resistivity of $3.5 \times 10^{-6}$ Ω·cm.

Example 16

A water-based silver colloidal solution was obtained through a method similar to that used in Example 15 except that the amount of the silver nitrate was changed to 26 grams, 20 grams of polyvinyl pyrrolidone (molecular weight: 25,000) was used as the dispersant, 10 grams of glutamic acid was used as the reducing agent, the reaction temperature was changed to 25° C., and the reaction time was changed to 30 minutes.

Next, the obtained silver colloidal solution was electrodialyzed using an ultrafiltration membrane to remove impurities. The solution was rinsed with pure water. The particle size distribution of the silver particles was measured using the above-described particle size analyzer. The result revealed that there was a sharp peak at a position of 40 nm.

The obtained silver colloidal solution was concentrated by centrifuging it at 10,000 rpm and then removing the supernatant fluid to reduce the water content to 10 wt. %. Ethanol and glycerin both as the water-soluble organic solvent were added to the solution. The solution was stirred with a magnetic stirrer until the added solvents were completely dispersed in the solution. The solution was concentrated by heating it until the concentration of the silver particles reached 60 wt. %. Thus, an inkjet-use silver ink whose dispersion medium was a mixed solution of water, ethanol, and glycerin was produced.

In the inkjet-use silver ink, the composition ratio in weight of the silver particles (Ag), the water (W), the ethanol (Et), and the glycerin (Gl) was obtained as Ag:W:Et:Gl=60:5:34:1. The measurements of the properties showed that the inkjet-use silver ink had a surface tension of 30 mN/m at 25° C., a viscosity of 3 mPa·s at 25° C., and a boiling point of 100° C. The particle size distribution of the silver particles in the inkjet-use silver ink was measured using the above-described particle size analyzer. The result showed that there was a sharp peak at a position of 40 nm. This result confirmed that the implementation of the production process of the inkjet-use silver ink did not vary the particle size distribution.

The inkjet-use silver ink was used for a one-hour continuous printing using a thermal-type inkjet printer. The ink-ejecting stability was satisfactory without developing any faulty ejection such as the clogging at the nozzle of the printer. In addition, the inkjet-use silver ink was printed on the surface of a glass substrate using a thermal-type inkjet printer. The printed figure was baked at 450° C. for 30 minutes in the atmosphere. Thus, a wiring circuit was formed that had a line width of L and a spacing of S expressed as L/S=120 μm/120 μm. The thickness of the wiring circuit was measured using a surface roughness tester (made by Tokyo Seimitsu Co., Ltd.). The result was 1 μm. The wiring circuit had a resistivity of $1.7 \times 10^{-6}$ Ω·cm.

Example 17

A water-based silver colloidal solution was obtained through a method similar to that used in Example 15 except that the amount of the silver nitrate was changed to 26 grams, five grams of polyvinyl pyrrolidone (molecular weight: 30,000) was used as the dispersant, 20 grams of myristic acid was used as the reducing agent, the reaction temperature was changed to 25° C., and the reaction time was changed to 120 minutes.

Next, the obtained silver colloidal solution was electrodialyzed using an ultrafiltration membrane to remove impurities. The solution was rinsed with pure water. The particle size distribution of the silver particles was measured using the above-described particle size analyzer. The result revealed that there was a sharp peak at a position of 15 nm.

The obtained silver colloidal solution was concentrated by centrifuging it at 10,000 rpm and then removing the supernatant fluid to reduce the water content to 12 wt. %. Ethanol as the water-soluble organic solvent was added to the solution. The solution was stirred with a magnetic stirrer until the added solvent was completely dispersed in the solution. The solution was concentrated by heating it until the concentration of the silver particles reached 25 wt. %. Thus, an inkjet-use silver ink whose dispersion medium was a mixed solution of water and ethanol was produced.

In the inkjet-use silver ink, the composition ratio in weight of the silver particles (Ag), the water (W), and the ethanol (Et) was obtained as Ag:W:Et=25:2:73. The measurements of the properties showed that the inkjet-use silver ink had a surface tension of 24 mN/m at 25° C., a viscosity of 2 mPa·s at 25° C., and a boiling point of 82° C. The particle size distribution of the silver particles in the inkjet-use silver ink was measured using the above-described particle size analyzer. The result showed that there was a sharp peak at a position of 15 nm. This result confirmed that the implementation of the production process of the inkjet-use silver ink did not vary the particle size distribution.

The inkjet-use silver ink was used for a one-hour continuous printing using a thermal-type inkjet printer. The ink-ejecting stability was satisfactory without developing any faulty ejection such as the clogging at the nozzle of the printer. In addition, the inkjet-use silver ink was printed on the surface of a synthetic-resin substrate using a thermal-type inkjet printer. The printed figure was baked at 180° C. for 60 minutes in the atmosphere. Thus, a wiring circuit was formed that had a line width of L and a spacing of S expressed as L/S=50 μm/50 μm. The thickness of the wiring circuit was measured using a surface roughness tester (made by Tokyo Seimitsu Co., Ltd.). The result was 0.2 μm. The wiring circuit had a resistivity of $6.5 \times 10^{-6}$ Ω·cm.

Comparative Example 6

The water-based silver colloidal solution that was obtained in Example 12 and that had a sharp peak at a position of 15 nm was heated at 70° C. to evaporate the water and remove it completely. Thus, the silver particles were separated from water completely. Then, 2-butoxyethanol and polyethylene glycol (average molecular weight: 200) were added to the solution. The solution was stirred with a magnetic stirrer until the added solvents were completely dispersed in the solution. The solution was concentrated by heating it until the concentration of the silver particles reached 30 wt. %. Thus, an inkjet-use silver ink whose dispersion medium was 2-butoxyethanol and polyethylene glycol was produced.

In the inkjet-use silver ink, the composition ratio in weight of the silver particles (Ag), the 2-butoxyethanol (BE), and the polyethylene glycol (PEG) was obtained as Ag:BE:PEG=30:50:20. The measurements of the properties showed that the inkjet-use silver ink had a surface tension of 65 mN/m at 25° C., a viscosity of 32 mPa·s at 25° C., and a boiling point of 150° C. The particle size distribution of the silver particles in the inkjet-use silver ink was measured using the above-described particle size analyzer. The result showed that there was a peak at a position of 1,500 nm. This result explained that when the silver particles were separated from water completely, aggregation of the silver particles developed, so that the particle size distribution varied greatly.

The inkjet-use silver ink was used for a one-hour continuous printing using a piezoelectric-type inkjet printer. The ink-ejecting stability was unsatisfactory because faulty ejection developed, such as the clogging at the nozzle of the printer. In addition, the inkjet-use silver ink was printed on the surface of a glass substrate using a piezoelectric-type inkjet printer. The printed figure was baked at 200° C. for 30 minutes in the atmosphere. Thus, a wiring circuit was formed that had a line width of L and a spacing of S expressed as L/S=300 μm/300 μm. The thickness of the wiring circuit was measured using a surface roughness tester (made by Tokyo Seimitsu Co., Ltd.). The result was 0.3 μm. The wiring circuit had a resistivity of $2.5 \times 10^{-5}$ Ω·cm.

Comparative Example 7

The water-based silver colloidal solution that was obtained in Example 13 and that had a sharp peak at a position of 8 nm was concentrated using a rotary evaporator to reduce the water content to 15 wt. %. Then, α-terpineol, which is a water-insoluble organic solvent, was added to the solution. The solution was stirred with a magnetic stirrer. However, it was impossible to obtain a uniform inkjet-use silver ink, because the solution separated into two types of liquids.

(Inkjet-use Palladium Ink)

Example 18

First, 21 grams of palladium chloride (II) was dissolved in 300 grams of pure water. Second, 20 grams of polyacrylic acid (molecular weight: 5,000) as the dispersant was added to the solution and dissolved in it completely. Third, 80 grams of 2-propanol as the reducing agent was added to the palladium chloride solution. The solution was stirred at a stirring rate of 1,000 rpm for 60 minutes at 40° C. to cause the chemical reaction to proceed. Thus, a water-based palladium colloidal solution having a black color was obtained.

Next, the obtained palladium colloidal solution was centrifuged at 20,000 G for 20 minutes to remove impurities lighter than the palladium particles. This removing operation was repeated. The solution was rinsed with pure water. The particle size distribution of the palladium particles was measured using the above-described particle size analyzer. The result revealed that there was a sharp peak at a position of 3 nm.

The obtained palladium colloidal solution was concentrated by heating it at 70° C. to reduce the water content to 10 wt. %. Then, 2-ethoxyethanol and glycerin both as the water-soluble organic solvent were added to the solution. The solution was stirred with a magnetic stirrer until the added solvents were completely dispersed in the solution. The solution was concentrated by heating it until the concentration of the palladium particles reached 25 wt. %. Thus, an inkjet-use palladium ink whose dispersion medium was a mixed solution of water, 2-ethoxyethanol, and glycerin was produced.

In the inkjet-use palladium ink, the composition ratio in weight of the palladium particles (Pd), the water (W), the 2-ethoxyethanol (EE), and the glycerin (Gl) was obtained as Pd:W:EE:Gl=25:2:70:3. The measurements of the properties showed that the inkjet-use palladium ink had a surface tension of 32 mN/m at 25° C., a viscosity of 12 mPa·s at 25° C., and a boiling point of 200° C. The particle size distribution of the palladium particles in the inkjet-use palladium ink was measured using the above-described particle size analyzer. The result showed that there was a sharp peak at a position of 3 nm. This result confirmed that the implementation of the production process of the inkjet-use palladium ink did not vary the particle size distribution.

The inkjet-use palladium ink was used for a one-hour continuous printing using a piezoelectric-type inkjet printer. The ink-ejecting stability was satisfactory without developing any faulty ejection such as the clogging at the nozzle of the printer. In addition, the inkjet-use palladium ink was printed on the surface of a glass substrate using a piezoelectric-type inkjet printer. The printed figure was baked at 250° C. for 30 minutes in the atmosphere. Thus, a wiring circuit was formed that had a line width of L and a spacing of S expressed as L/S=100 µm/100 µm. The thickness of the wiring circuit was measured using a surface roughness tester (made by Tokyo Seimitsu Co., Ltd.). The result was 0.2 µm. The wiring circuit had a resistivity of $1.8 \times 10^{-5}$ Ω·cm.

Example 19

A water-based palladium colloidal solution was obtained through a method similar to that used in Example 18 except that five grams of polyethylene imine (molecular weight: 1,800) was used as the dispersant, 16 grams of titanium trichloride was used as the reducing agent, the reaction temperature was changed to 25° C., and the reaction time was changed to 30 minutes.

Next, the obtained palladium colloidal solution was electrodialyzed using an ultrafiltration membrane to remove impurities. The solution was rinsed with pure water. The particle size distribution of the palladium particles was measured using the above-described particle size analyzer. The result revealed that there was a sharp peak at a position of 4 nm.

The obtained palladium colloidal solution was concentrated using a rotary evaporator to reduce the water content to 22 wt. %. Ethanol, glycerin, and acetone all as the water-soluble organic solvent were added to the solution. The solution was stirred with a magnetic stirrer until the added solvents were completely dispersed in the solution. The solution was concentrated by heating it until the concentration of the palladium particles reached 60 wt. %. Thus, an inkjet-use palladium ink whose dispersion medium was a mixed solution of water, ethanol, glycerin, and acetone was produced.

In the inkjet-use palladium ink, the composition ratio in weight of the palladium particles (Pd), the water (W), the ethanol (Et), the glycerin (Gl), and acetone (Ac) was obtained as Pd:W:Et:Gl:Ac=60:10:10:5:15. The measurements of the properties showed that the inkjet-use palladium ink had a surface tension of 30 mN/m at 25° C., a viscosity of 1.5 mPa·s at 25° C., and a boiling point of 95° C. The particle size distribution of the palladium particles in the inkjet-use palladium ink was measured using the above-described particle size analyzer. The result showed that there was a sharp peak at a position of 4 nm. This result confirmed that the implementation of the production process of the inkjet-use palladium ink did not vary the particle size distribution.

The inkjet-use palladium ink was used for a one-hour continuous printing using a thermal-type inkjet printer. The ink-ejecting stability was satisfactory without developing any faulty ejection such as the clogging at the nozzle of the printer. In addition, the inkjet-use palladium ink was printed on the surface of a glass substrate using a thermal-type inkjet printer. The printed figure was baked at 200° C. for 30 minutes in the atmosphere. Thus, a wiring circuit was formed that had a line width of L and a spacing of S expressed as L/S=200 µm/200 µm. The thickness of the wiring circuit was measured using a surface roughness tester (made by Tokyo Seimitsu Co., Ltd.). The result was 0.4 µm. The wiring circuit had a resistivity of $3.0 \times 10^{-5}$ Ω·cm.

Comparative Example 8

The water-based palladium colloidal solution that was obtained in Example 19 and that had a sharp peak at a position of 4 nm was concentrated using a rotary evaporator to reduce the water content to 22 wt. %. Then, α-terpineol, which is a water-insoluble organic solvent, was added to the solution. The solution was stirred with a magnetic stirrer. However, it was impossible to obtain a uniform inkjet-use palladium ink, because the solution separated into two types of liquids.

(Inkjet-use Gold Ink)

Example 20

First, 42 grams of tetrachloroaurate (III) 4hydrate was dissolved in 150 grams of pure water. Second, 16 grams of polyvinyl alcohol (molecular weight: 22,000) as the dispersant was added to the solution and dissolved in it completely. Third, 22 grams of ascorbic acid as the reducing agent was added to the gold chloride solution. The solution was stirred at a stirring rate of 1,000 rpm for 15 minutes at 5° C. to cause the chemical reaction to proceed. Thus, a water-based gold colloidal solution having a reddish-purple plasmon absorption was obtained.

Next, the obtained gold colloidal solution was electrodialyzed using an ultrafiltration membrane to remove impurities. The solution was rinsed with pure water. The particle size distribution of the gold particles was measured using the above-described particle size analyzer. The result revealed that there was a sharp peak at a position of 5 nm.

The obtained gold colloidal solution was concentrated using a rotary evaporator to reduce the water content to 15 wt. %. Then, 2-butoxyethanol and polyethylene glycol (average molecular weight: 200) both as the water-soluble organic solvent were added to the solution. The solution was stirred with a magnetic stirrer until the added solvents were completely dispersed in the solution. The solution was concentrated by heating it until the concentration of the gold particles reached 25 wt. %. Thus, an inkjet-use gold ink whose dispersion medium was a mixed solution of water, 2-butoxyethanol and polyethylene glycol was produced.

In the inkjet-use gold ink, the composition ratio in weight of the gold particles (Au), the water (W), the 2-butoxyethanol (BE), and the polyethylene glycol (PEG) was obtained as Au:W:BE:PEG=25:4:65:6. The measurements of the properties showed that the inkjet-use gold ink had a surface tension of 35 mN/m at 25° C., a viscosity of 18 mPa·s at 25° C., and a boiling point of 200° C. The particle size distribution of the gold particles in the inkjet-use gold ink was measured using the above-described particle size analyzer. The result showed that there was a sharp peak at a position of 5 nm. This result confirmed that the implementation of the production process of the inkjet-use gold ink did not vary the particle size distribution.

The inkjet-use gold ink was used for a one-hour continuous printing using a piezoelectric-type inkjet printer. The ink-ejecting stability was satisfactory without developing any faulty ejection such as the clogging at the nozzle of the printer. In addition, the inkjet-use gold ink was printed on the surface of a synthetic-resin substrate using a piezoelectric-type inkjet printer. The printed figure was baked at 150° C. for 120 minutes in the atmosphere. Thus, a wiring circuit was formed that had a line width of L and a spacing of S expressed as L/S=50 μm/50 μm. The thickness of the wiring circuit was measured using a surface roughness tester (made by Tokyo Seimitsu Co., Ltd.). The result was 0.3 μm. The wiring circuit had a resistivity of $7.5 \times 10^{-6}$ Ω·cm.

Example 21

A water-based gold colloidal solution was obtained through a method similar to that used in Example 20 except that 10 grams of polyvinyl pyrrolidone (molecular weight: 30,000) was used as the dispersant, 80 grams of 2-propanol was used as the reducing agent, the reaction temperature was changed to 40° C., and the reaction time was changed to 60 minutes.

Next, the obtained gold colloidal solution was centrifuged at 20,000 G for 20 minutes to remove impurities lighter than the gold particles. This removing operation was repeated. The solution was rinsed with pure water. The particle size distribution of the gold particles was measured using the above-described particle size analyzer. The result revealed that there was a sharp peak at a position of 15 nm.

The obtained gold colloidal solution was concentrated by heating it at 70° C. to reduce the water content to 3 wt. %. Methyl ethyl ketone as the water-soluble organic solvent was added to the solution. Then, the solution was stirred with a magnetic stirrer until the added solvent was completely dispersed in the solution. The solution was concentrated by heating it until the concentration of the gold particles reached 40 wt. %. Thus, an inkjet-use gold ink whose dispersion medium was a mixed solution of water and methyl ethyl ketone was produced.

In the inkjet-use gold ink, the composition ratio in weight of the gold particles (Au), the water (W), and the methyl ethyl ketone (MEK) was obtained as Au:W:MEK=40:1:59. The measurements of the properties showed that the inkjet-use gold ink had a surface tension of 29 mN/m at 25° C., a viscosity of 2 mPa·s at 25° C., and a boiling point of 85° C. The particle size distribution of the gold particles in the inkjet-use gold ink was measured using the above-described particle size analyzer. The result showed that there was a sharp peak at a position of 15 nm. This result confirmed that the implementation of the production process of the inkjet-use gold ink did not vary the particle size distribution.

The inkjet-use gold ink was used for a one-hour continuous printing using a thermal-type inkjet printer. The ink-ejecting stability was satisfactory without developing any faulty ejection such as the clogging at the nozzle of the printer. In addition, the inkjet-use gold ink was printed on the surface of a glass substrate using a thermal-type inkjet printer. The printed figure was baked at 350° C. for 20 minutes in the atmosphere. Thus, a wiring circuit was formed that had a line width of L and a spacing of S expressed as L/S=100 μm/100 μm. The thickness of the wiring circuit was measured using a surface roughness tester (made by Tokyo Seimitsu Co., Ltd.). The result was 0.5 μm. The wiring circuit had a resistivity of $3.0 \times 10^{-6}$ Ω·cm.

Comparative Example 9

The water-based gold colloidal solution that was obtained in Example 20 and that had a sharp peak at a position of 5 nm was treated with a rotary evaporator to evaporate the water and remove it completely. Thus, the gold particles were separated from water completely. Then, 2-butoxyethanol and polyethylene glycol (average molecular weight: 200) were added to the solution. The solution was stirred with a magnetic stirrer until the added solvents were completely dispersed in the solution. The solution was concentrated by heating it until the concentration of the gold particles reached 10 wt. %. Thus, an inkjet-use gold ink whose dispersion medium was 2-butoxyethanol and polyethylene glycol was produced.

In the inkjet-use gold ink, the composition ratio in weight of the gold particles (Au), the 2-butoxyethanol (BE), and the polyethylene glycol (PEG) was obtained as Au:BE:PEG=10:85:5. The measurements of the properties showed that the inkjet-use gold ink had a surface tension of 65 mN/m at 25° C., a viscosity of 18 mPa·s at 25° C., and a boiling point of 200° C. The particle size distribution of the gold particles in the inkjet-use gold ink was measured using the above-described particle size analyzer. The result showed that there was a peak at a position of 600 nm. This result explained that when the gold particles were separated from water completely, aggregation of the gold particles developed, so that the particle size distribution varied greatly.

The inkjet-use gold ink was used for a one-hour continuous printing using a piezoelectric-type inkjet printer. The ink-ejecting stability was unsatisfactory because faulty ejection developed, such as the clogging at the nozzle of the printer. In addition, the inkjet-use gold ink was printed on the surface of a glass substrate using a piezoelectric-type inkjet printer. The printed figure was baked at 200° C. for 30 minutes in the atmosphere. Thus, a wiring circuit was formed that had a line width of L and a spacing of S expressed as L/S=400 μm/400 μm. The thickness of the wiring circuit was measured using a surface roughness tester (made by Tokyo Seimitsu Co., Ltd.). The result was 0.1 μm. The wiring circuit had a resistivity of $4.0 \times 10^{-4}$ Ω·cm.

What is claimed is:

1. A metallic colloidal solution comprising:

(a) metallic particles selected from the group consisting of nickel, copper, silver, gold, platinum, palladium, and an alloy of these metals that:

(a1) are deposited by reducing metallic ions in water; and (a2) have a primary-particle diameter of at most 200 nm;

(b) a dispersant having a molecular weight of 200 to 30,000; and (c) a dispersion medium made of a mixed solvent of water and a water-soluble organic solvent, wherein the water-soluble organic solvent is a glycol ether, and the ratio of the water-soluble organic solvent to the mixed solvent is at least 70 percent, but less than 100 percent by weight.

2. A metallic colloidal solution as defined by claim 1, the metallic colloidal solution being produced:

(a) by using as a starting material a water-based metallic colloidal solution obtained by depositing metallic particles through the reduction of metallic ions in water; and (b) without undergoing a process that completely separates the metallic particles from water.

3. A metallic colloidal solution as defined by claim 1, wherein the content of the metallic particles is 0.1 to 90 wt. %.

4. A metallic colloidal solution as defined by claim 1, wherein the dispersant is an organic compound that does not contain any of sulfur, phosphorus, boron, and a halogen atom.

5. A metallic colloidal solution as defined by claim 1, wherein the amount of the dispersant is 2 to 30 weight parts per 100 weight parts of the metallic particles.

6. An inkjet-use metallic ink incorporating a metallic colloidal solution comprising:

(a) metallic particles selected from the group consisting of nickel, copper, silver, gold, platinum, palladium, and an alloy of these metals that:

(a1) are deposited by reducing metallic ions in water; and (a2) have a primary-particle diameter of at most 200 nm;

(b) a dispersant having a molecular weight of 200 to 30,000; and (c) a dispersion medium made of a mixed solvent of water and a water-soluble organic solvent, wherein the water-soluble organic solvent is a glycol ether, and the ratio of the water-soluble organic solvent to the mixed solvent is at least 70 percent by weight, but less than 100 percent by weight.

7. An inkjet-use metallic ink as defined by claim 6, the inkjet-use metallic ink having a surface tension of 20 to 60 mN/m at 25° C. and a viscosity of 0.5 to 40 mPa·s at 25° C.

8. An inkjet-use metallic ink as defined by claim 6, wherein the metallic colloidal solution is produced:

(a) by using as a starting material a water-based metallic colloidal solution obtained by depositing metallic particles through the reduction of metallic ions in water; and (b) without undergoing a process that completely separates the metallic particles from water.

* * * * *